United States Patent

Karam et al.

Patent Number: 5,107,520
Date of Patent: Apr. 21, 1992

[54] ADAPTIVE PREDISTORTION CIRCUIT FOR A DIGITAL TRANSMISSION SYSTEM

[75] Inventors: Georges Karam, Paris; Hikmet Sari, Creteil, both of France

[73] Assignee: U.S. Philips Corporation, New York, N.Y.

[21] Appl. No.: 462,662

[22] Filed: Jan. 9, 1990

[30] Foreign Application Priority Data

Jan. 24, 1989 [FR] France .................................. 89 00813

[51] Int. Cl.$^5$ .................... H04L 25/49; H04L 25/03
[52] U.S. Cl. ..................................... 375/60; 332/123; 332/124; 332/159; 332/160; 455/126
[58] Field of Search .................. 375/60; 455/126, 115, 455/114; 332/123, 124, 159, 160, 162

[56] References Cited

U.S. PATENT DOCUMENTS

| 4,412,337 | 10/1983 | Bickley et al. | 375/60 |
| 4,639,938 | 1/1987 | Kennett | 375/60 |
| 4,750,192 | 6/1988 | Dzung | 375/60 |
| 4,890,300 | 12/1989 | Andrews | 375/60 |

Primary Examiner—Douglas W. Olms
Assistant Examiner—Ralph Smith
Attorney, Agent, or Firm—Steven R. Biren

[57] ABSTRACT

An adaptive predistortion circuit for a digital transmission system includes a predistortion circuit ($52_1$, $52_2$, $52_3$) for predistorting the input data before they pass through a modulator (56) and then through an amplifier (57), and an adaptation circuit ($61_1$, $61_2$, $61_3$) for continuously adapting the predistortion circuit to the stream of input data in response to a demodulation of the stream of transmitted data. The predistortion circuit further includes an encoder (51) which, on a first path, in response to digital data $a_k$, generates digital data $b_k$ which leave a first predistortion circuit ($52_1$) in a predistorted manner in-phase with the symbol clock, on a second path, digital data $c_k$ which leave a second distortion circuit ($52_2$) in a predistorted manner phase-shifted by T/3 relative to the symbol clock and on a third path, digital data $d_k$ which leave a third predistortion circuit ($52_3$) in a predistorted manner phase-shifted by 2T/3 relative to the symbol clock. The signals $b_k$, $c_k$ and $d_k$ are obtained by means of a polynomial encoding. The encoding may be performed by shift registers ($62_1 \ldots 62_l$) addressing a memory (63) or, by a transversal filter ($71_1$, $71_2$, $71_3$). It may also be obtained by means of an analog transmission filter (81) followed by samplers ($81_1$, $82_2$, $82_3$).

11 Claims, 8 Drawing Sheets

ADAPTIVE PREDISTORTION CIRCUIT FOR A DIGITAL TRANSMISSION SYSTEM

BACKGROUND OF THE INVENTION

The invention relates to an adaptive predistortion circuit for a digital transmission system for sending input data at the rate of a symbol clock having a period T with the aid of a modulator and a power amplifier which distorts the data, the circuit comprising:
- a predistortion circuit for predistorting in the opposite sense the input data prior to their entering the amplifier in order to transmit the expected input data,
- an adoption circuit for continuously adapting the predistortion circuit to the stream of input data in response to a demodulation of the stream of transmitted data,
- and a filter performing a signal shaping.

The invention finds its applications in the digital transmission systems such as the data transmission modems, radio relay links, space communications systems.

For an efficient use of the available spectrum, the current digital transmission systems, specifically the radio relay links and the systems for transmitting data over the telephone channel, use modulation methods with large numbers of phase and amplitude states. These modulation methods are very sensitive to all types of distortion, and of course to non-linear types of distortion caused by amplifiers, mixers and other non-linear circuits in the transmission chain. A particularly critical point with respect to radio relay links and satellite transmission is the non-linearity of the transmitter power amplifier or the on-board power amplifier in the case of satellite transmissions. These amplifiers are known for their non-linear characteristics. If they are used in their linear zone, the full extent of their power is not utilized. If they are made to operate near to their saturation power level, they will distort the signal in an unacceptable manner. In practice, for a given power amplifier, one fixes the level of the transmitted signal such as to establish a compromise between the signal-to-noise ratio and the non-linear distortion undergone by the signal. Thus the optimum operating point of the amplifier is the one at which the joint effects of the additive noise of the channel and of the non-linear distortion of the amplifier are minimized. For modulation methods with a large number of states (64-QAM and 256-QAM, for example), this point is remote from the saturation power level of the amplifier, which implies that the latter is not used efficiently. In order to enhance its efficiency, predistortion techniques (fixed or adaptive) are currently used which make it possible to reduce the effect of the power amplifier's non-linearity on the transmitted signal.

A currently used predistortion technique consists of inserting in the intermediate-frequency stage of the transmitter a non-linear circuit for realizing an approximation of the inverse function of the power amplifier whose non-linearities one seeks to compensate. If the exact inverse of the function of the amplifier could be synthesized, this technique would make it possible to have a perfect signal at the output (without any non-linear distortion). However, this cannot be realized because the exact inverse would require a circuit of infinite complexity. In practice one is satisfied with making an approximation and in most cases the Taylor series representing the non-linear function of the amplifier is limited to the third order and a predistortion circuit is synthesized, also of the third order, in a manner such that the two cascaded circuits no longer have third-order distortion. Higher-order terms (fifth order and seventh order) appear at the output but have smaller amplitudes compared to the initial third-order distortion. The result is then a certain improvement of the performance of the system. A disadvantage of these predistortion circuits in the intermediate frequency stage resides in the fact that they are analog circuits. They are hard to make adaptive and require from time to time an intervention to readjust them and compensate for the variations of the amplifier response according to time and temperature. This predistortion technique has to be dispensed with if one wishes to have an automatic send power control.

Another more recent predistortion technique consists of modifying the alphabet of data to be transmitted. This technique called "Data Predistortion" or "Baseband Predistortion" is known from U.S. Pat. No. 4,291,277 and from the article by A. A. M. SALEH and J. SALZ "Adaptive Linearization of Power Amplifiers in Digital Radio Systems", Bell System Technical Journal, Vol. 62, April 1983, pp. 1019-1033.

In the article by A. A. M. SALEH and J. SALZ, FIG. 1 is a schematic representation of an adaptive predistortion circuit which supplies to the input of the modulator a distorted constellation on the basis of the original square constellation, for example, an amplitude modulation of two quadrature carriers (QAM). The amplifier acts on the constellation by producing a net compression and a net rotation of the points having large amplitudes. In order to compensate for this effect the original constellation is distorted so that it resumes its original square shape after passing through the power amplifier. Thus, when the distortion circuit is optimized, it forms the inverse of the power amplifier (apart from a constant gain and a constant phase shift) and allows for perfectly compensating for the non-linearities of the amplifier. In order to make this circuit adaptive, the signal is recaptured at the output of the amplifier, demodulated, then sampled at the symbol transmission rate 1/T and these samples are compared to the points corresponding with the QAM constellation used. These comparisons make it possible to obtain a control signal which enables optimization of the predistortion circuit with the aid of a conventional algorithm. However, the scheme used in FIG. 1 is very simplistic because it does not have any filtering before the modulator or before the power amplifier. Thus, it does not correspond with the solution generally used. In effect, in the real systems (cf. U.S. Pat. No. 4,291,277), a spectral signal shaping filtering of the Nyquist type is always used which makes it possible to limit the signal band while a zero intersymbol interference at the decision instants is guaranteed. This filtering is generally equally divided between the send and receive ends so as to maximize the signal-to-noise ratio at the decision instants. In such systems the effect of the non-linearity of the amplifier is twofold: the constellation is not only deformed but intersymbol interference appears, associating a cloud of points to each point of the constellation. With the above-described predistortion technique it is, however, not possible to compensate for this second effect.

SUMMARY OF THE INVENTION

It is an object of the invention to realize an adaptive predistortion circuit which not only corrects the constellation but also considerably reduces the dispersion of each point of the original constellation into a cloud of points and also of ensures a better protection against interference from adjacent channels at the receive end.

According to the invention this object is achieved by means of an adaptive predistortion circuit as described above, characterized in that the circuit comprises an encoder generating, on the basis of digital data $a_k$ (k being an integer):

on a first path, digital data $b_k$ leaving a first predistortion circuit in a predistorted condition as digital data $b_k$ in-phase with the symbol clock, on a second path, digital data $c_k$ leaving a second predistortion circuit in a predistorted condition as digital data $c_k$ phase-shift by T/3 with respect to the symbol clock, on a third path, digital data $d_k$ leaving a third predistortion circuit in a predistorted condition as digital data $d'_k$ phase-shifted by 2T/3 with respect to the symbol clock, the signals $b_k$, $c_k$ and $d_k$ being obtained at the instants kT, kT+T/3, kT+2T/3 by means of an n-th order polynomial encoding of the type of $F(D)=(1+D)^n$, where D is a delay of 2T/3, the encoding being associated to an ideal low-pass filtering of bandwidth $(-3/(4T), 3/(4T))$, the encoding and filtering jointly operating on the data $a_k$ in accordance with a frequency-shaping filtering given by the transfer function:

$$H(\omega)=\cos^n(\omega T/3) \text{ for } |\omega| \leq 3\pi/(2T)$$

where n is a positive integer, the predistorted data of the three paths being added together in an adder circuit and then converted into an analog signal by a digital-to-analog converter, the analog signal being filtered by the low-pass output filter whose ideal transfer function is equal to 1 for $f<3/(4T)$ and zero for $f>9/(4T)$, f being the frequency, after which it is sent to the modulator and then to the amplifier, the sent data being demodulated and then digitized so as to realize the adaptation with the aid of three adaptation circuits, one of which operating in-phase and the others phase shifted by T/3 and 2T/3 with respect to the symbol clock for adapting each the corresponding predistortion circuit.

According to a first embodiment the encoder determines the data $b_k$, $c_k$ and $d_k$ so that:

$$b_k = \sum_{i=-J}^{J} h_{i,0} \cdot a_{k-i} \text{ with } h_{i,0} = h(iT).$$

$$c_k = \sum_{i=-J}^{J} h_{i,1} \cdot a_{k-i} \text{ with } h_{i,1} = h(iT + T/3)$$

$$d_k = \sum_{i=-J}^{J} h_{i,2} \cdot a_{k-i} \text{ with } h_{i,2} = h(iT + 2T/3)$$

where $h_{i,0}$, $h_{i,1}$ and $h_{i,2}$ are coefficients of the impulse response h(t) of the filter $H(\omega)$ characterizing the spectral signal shaping at the send end, and where $(2J+1)\cdot T$ is the truncating length of the impulse response h(t).

According to a first variant of the first embodiment the encoder may comprise a set of shift registers having I stages, where $I=2J+1$, in which the data $a_k$, $a_{k-1}$, $a_{k-2}$ ... $a_{k-I}$ pass, that are used to address at least one memory which performs the encoding of the data $a_k$ into data $b_k$, $c_k$ and $d_k$.

According to a second variant of the first embodiment the encoder may be a transversal filter comprising a set of shift registers having I stages in which the data $a_k$, $a_k-1$, $a_k-2$ ... $a_k-I$ pass, which are multiplied:

on a first path, by the respective coefficients $h_{i,0}$, the products being added together to produce the data $b_k$, on a second path by the respective coefficients $h_{i,1}$, the products being added together to produce the data $c_k$, on a third path by the respective coefficients $h_{i,2}$, the products being added together to produce the data $d_k$.

According to a second embodiment, in order to carry out the polynomial encoding, the encoder comprises an analog send filter having the transfer function $H(\omega)$, whose output is connected to three samplers operating at the respective instants kT, kT+T/3 and kT+2T/3, which samplers are connected each to an analog-to-digital converter to produce the respective digital data $b_k$, $c_k$, $d_k$.

The adder circuit may be constituted by a multiplexer taking the predistorted data $b'_k$, $c'_k$ and $d'_k$ according to their own timing so as to send them to the modulator.

The three adaptation paths may each comprise an analog-to-digital converter preceded by a sampler inserted before the adaptation circuits.

Preferably, the predistortion circuits are random access memories producing the predistorted values on the in-phase path and on two phase-shifted paths.

In order to operate with a filtered send signal which corresponds with the situation which that occurs, it is necessary to make the corrections at more than one point per symbol duration. On the other hand, in order to improve the protection against interference from adjacent channels it is necessary to reduce the bandwidth occupied by the sent signal to less than 1/T. There is no filtering which guarantees a bandwidth of less than 1/T as well as discrete levels of the output signal occuring more than once per symbol duration. According to the invention a filtering is performed guaranteeing the protection against channel interference and which makes it possible to realize a predistortion at more than one point per symbol duration. Therefore, a filtering having the bandwidth $(-3/(4T), 3/(4T))$ which ensures quasi-discrete levels of the output signal of the filter at instants at T/3 spacing after which the quasi-discrete levels are transformed into discrete levels.

Thus, according to the invention it is possible to realize a signal correction at three points per symbol duration and reach at the same time a protection against interference from adjacent channels of about 30 dB in the radio relay links of $2\times140$ Mbit/sec, using a 256-QAM modulation and operating in the frequency planes with an interchannel spacing of 40 MHz. Similarly, this protection may reach 60 dB in the radio relay links at 140 Mbit/sec using a 64-QAM modulation and operating in frequency schemes with an interchannel spacing of 30 MHz. This enables use of the frequencies again.

The signals are obtained by means of a polynomial encoding of the type:

$$F(D) = \sum_{i=0}^{n} f_i \cdot D^i \tag{1}$$

where D is a delay element delaying by 2T/3, and the encoding is followed by an ideal low-pass filtering having a bandwidth of $(-3/(4T), 3/(4T))$. The signals thus obtained pass through a finite number of states at any instant kT/3, that is to say, at three points per symbol duration. The polynomials which are in agreement with equation (1) and are the most interesting are those which locate the signal energy at the lower frequencies (so as to minimize adjacent channel interference). The most appropriate polynomials are those which may be expressed in the form:

$$F(D) = (1+D)^n \tag{2}$$

where n is a positive integer. The parameter n (together with the basic alphabet) determines the number of states which can be assumed by the signal at the instants kT/3. The parameter n is to be chosen to be large in order not to limit this number of states. Such an encoding followed by an ideal low-pass filtering with the bandwidth $(-3/(4T), 3/(4T))$ yields:

$$H(\omega) = |\cos^n(\omega T/3)|, \ |\omega| \leq 3\pi/(2T) | 0, \text{ elsewhere} \tag{3}$$

for the spectrum of the sent signal.

After being low-pass filtered, the signal assumes a finite number of quasi-discrete levels. By truncating the impulse response h(t) to a finite number of samples (in the case of the first embodiment) or by making an N-bit analog-to-digital conversion of the output signal of the filter $H(\omega)$ every T/3 (in the case of the second embodiment), the signal assumes a finite number of states given by the alphabet:

of the symbols $b_k$ at instants kT
of the symbols $c_k$ at the instants kT+T/3
of the symbols $d_k$ at the instants kT+2T/3.

Thus the proposed category of the shaping filtering at the send end defines three constellations. The signal successively assumes the level of each constellation at the instants kT, kT+T/3, kT+2T/3.

The low-pass filtering following the operation of predistortion at the send end is not obliged to approach the ideal low-pass filter $(-3/(4T), 3/(4T))$ so that: it may have the form:

$$G(\omega) = \begin{cases} 1, & |\omega| < 3\pi/(2T) \\ \text{indifferent}, & 3\pi/(2T) \leq |\omega| \leq 9\pi/(2T) \\ 0, & |\omega| \geq 9\pi/(2T) \end{cases}$$

without undoing the signal shaping at the transmit end.

BRIEF DESCRIPTION OF THE DRAWING

The invention will be better understood with the aid of the following Figures given by way of non-limiting examples and respectively representing in.

DESCRIPTION OF THE PREFERRED EMBODIMENTS

Figure 1:
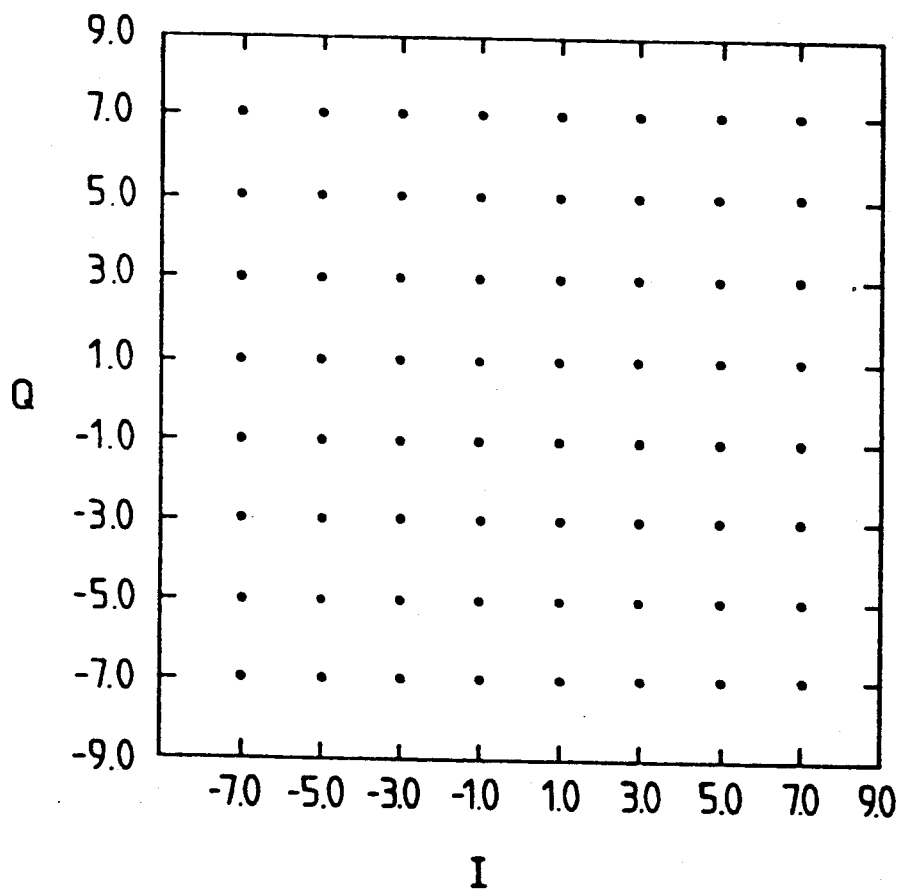
FIG. 1: the constellation of a 64-QAM modulation.

FIG. 1 is a repetition of the representation of the constellation of a signal of the 64-QAM type. The inputs I (in-phase) and Q (quadrature-phase) of the modulator are independent and the symbols on each path assume their values in an alphabet ($\pm d$, $\pm 3d$, $\pm 5d$, $\pm 7d$), where 2d is the minimum distance between of two adjacent points of the constellation.

Figure 2B:
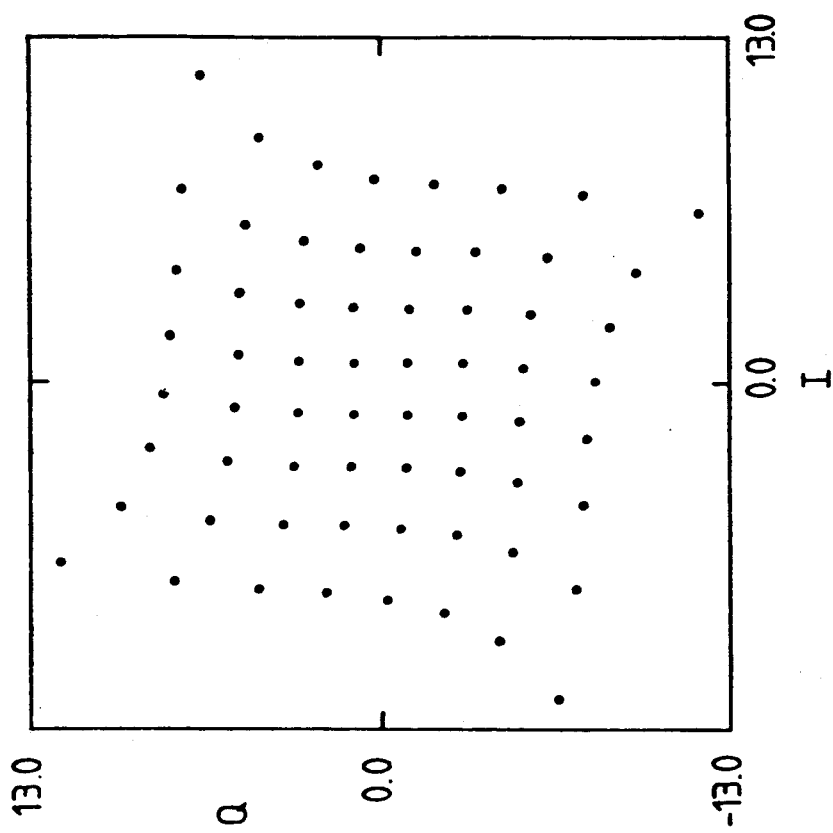
FIG. 2B: a predistorted constellation optimized for compensating for the distortion illustrated in FIG. 2A according to the prior-art frequencies.
Figure 2A:
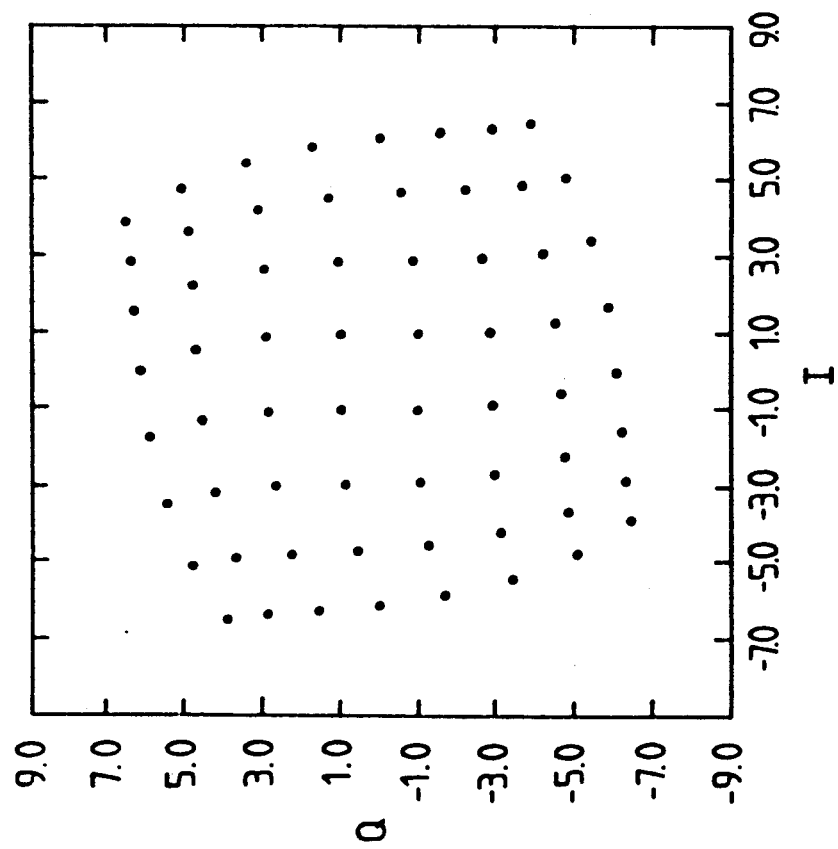
FIG. 2A: a 64-QAM constellation distorted by the power amplifier in a system without filtering or in the case in which all filtering is performed after the amplifier stage.

In order to be transmitted, the signal from the modulator is fed to a power amplifier which is generally used at reduced power, that is, in a linear part of its characteristic. At high power this amplifier is non-linear and distorts the signal in an unacceptable manner. If a constellation of the 64-QAM type is observed at the output of such an amplifier operating near saturation, a distorted constellation like the one represented in FIG. 2A will be observed. According to the prior art it will then be sufficient to predistort the constellation in the opposite sense according to the diagram of FIG. 2B, so that at the output of the amplifier the non-deformed constellation is obtained. However, so simple a situation is not in conformity with reality, where there is always filtering before the power amplifier specifically to limit the bandwidth of the signal. In the absence of filtering, the signal at the input of the modulator varies in steps once per symbol period T. Then, a predistortion circuit acting on the signal at a rate of 1/T allows of a perfect compensation. In contradistinction therewith, when the signal is filtered, it no longer varies in steps but in a continuous way. For a perfect compensation for the effect of non-linearity it is no longer sufficient to observe the signal once per symbol period T and to compensate for the distortion at these instants.

Figure 3B:
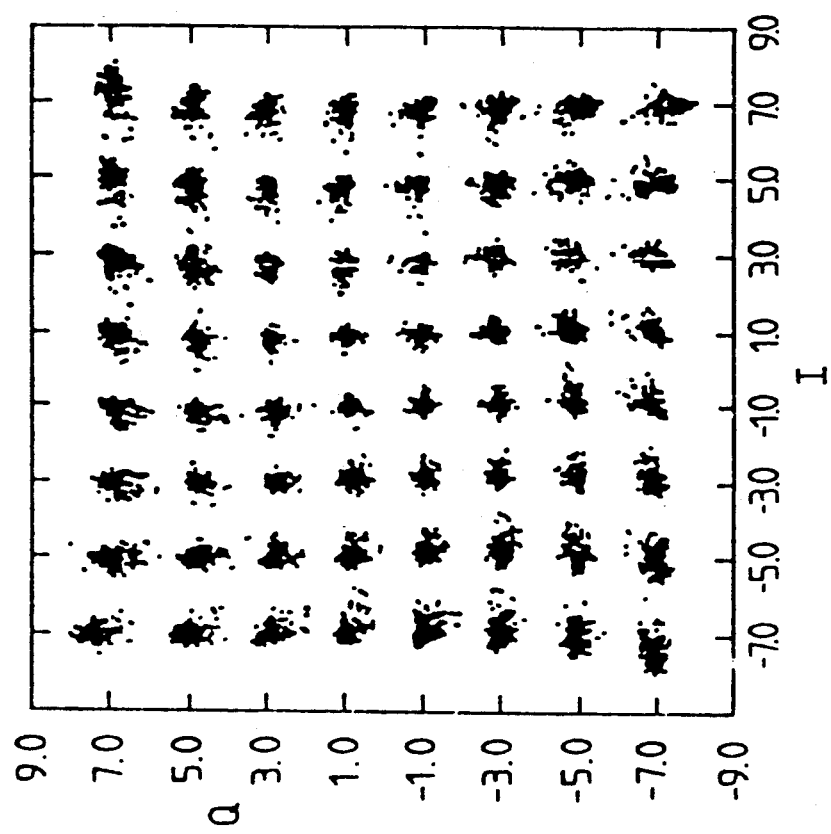
FIG. 3B: the distorted constellation with the same situation as in FIG. 3A, but now incorporating the prior-art predistortion circuit.
Figure 3A:
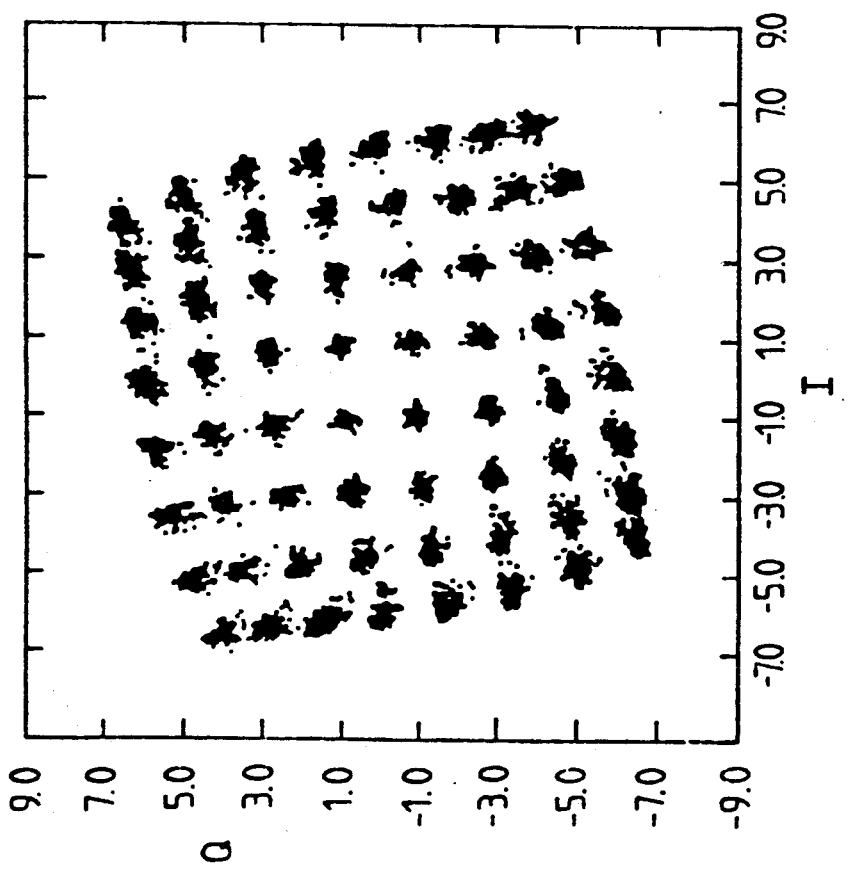
FIG. 3A: the constellation distorted by the amplifier as it appears when the total filtering is equally divided between the send and receive ends and the section at the send end is placed before the amplifier.

In the presence of a filtered signal the constellation at the output of the amplifier is represented in FIG. 3A. It becomes the one represented in FIG. 3B with the prior-art predistortion circuit. Thus, each point of the constellation becomes a cloud of points, which is unacceptable. In order to operate with a filtered signal, the correction thus has to be performed for more than one point per symbol period. Therefore, according to the invention, the input signal is subjected to an appropriate encoding in order to form an alphabet at the instants kT, kT+T/3 and kT+2T/3, a predistortion is subsequently separately effected for each of the three alphabets. The resulting signal is then filtered by a low-pass filter G(ω). According to the invention these cascaded encoding and filtering means have to present an impulse response with zero-crossings at any instant T+2kT/3 when k>0 and −T+2kT/3 when k>0.

Figure 4:
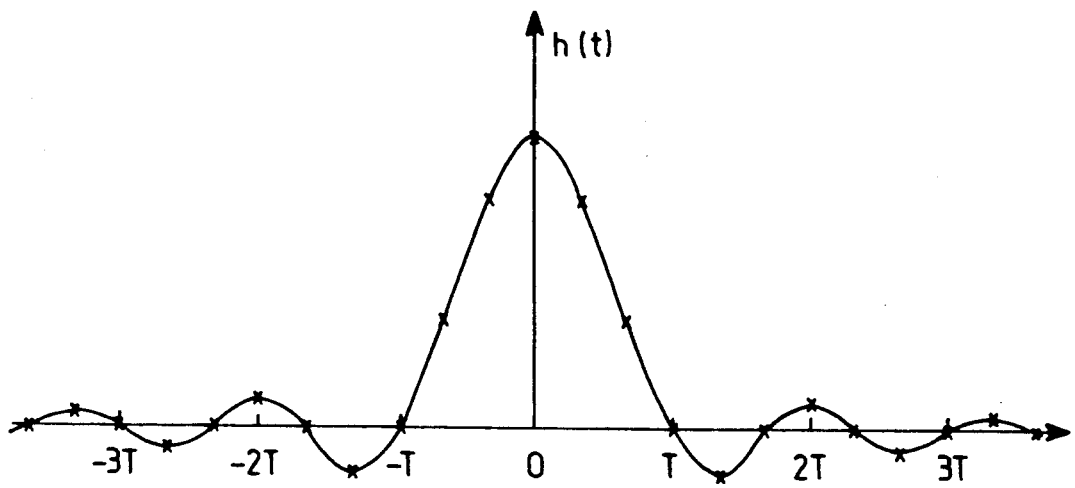
FIG. 4: an impulse response curve of the filtering at the send end (encoding followed by low-pass filtering) according to the invention in the case in which n=1.

FIG. 4 shows the impulse response of the type of filtering according to the invention in the case when n=1. It should be observed that the curve crosses zero at said instants. This makes it possible to obtain quasi-discrete output signal levels with a sampling at every T/3. These quasi-discrete levels are transformed into discrete levels according to one of the two embodiments. The compensation for the non-linearity is thus very efficient and at the output a signal having little distortion will be obtained.

Figure 5:
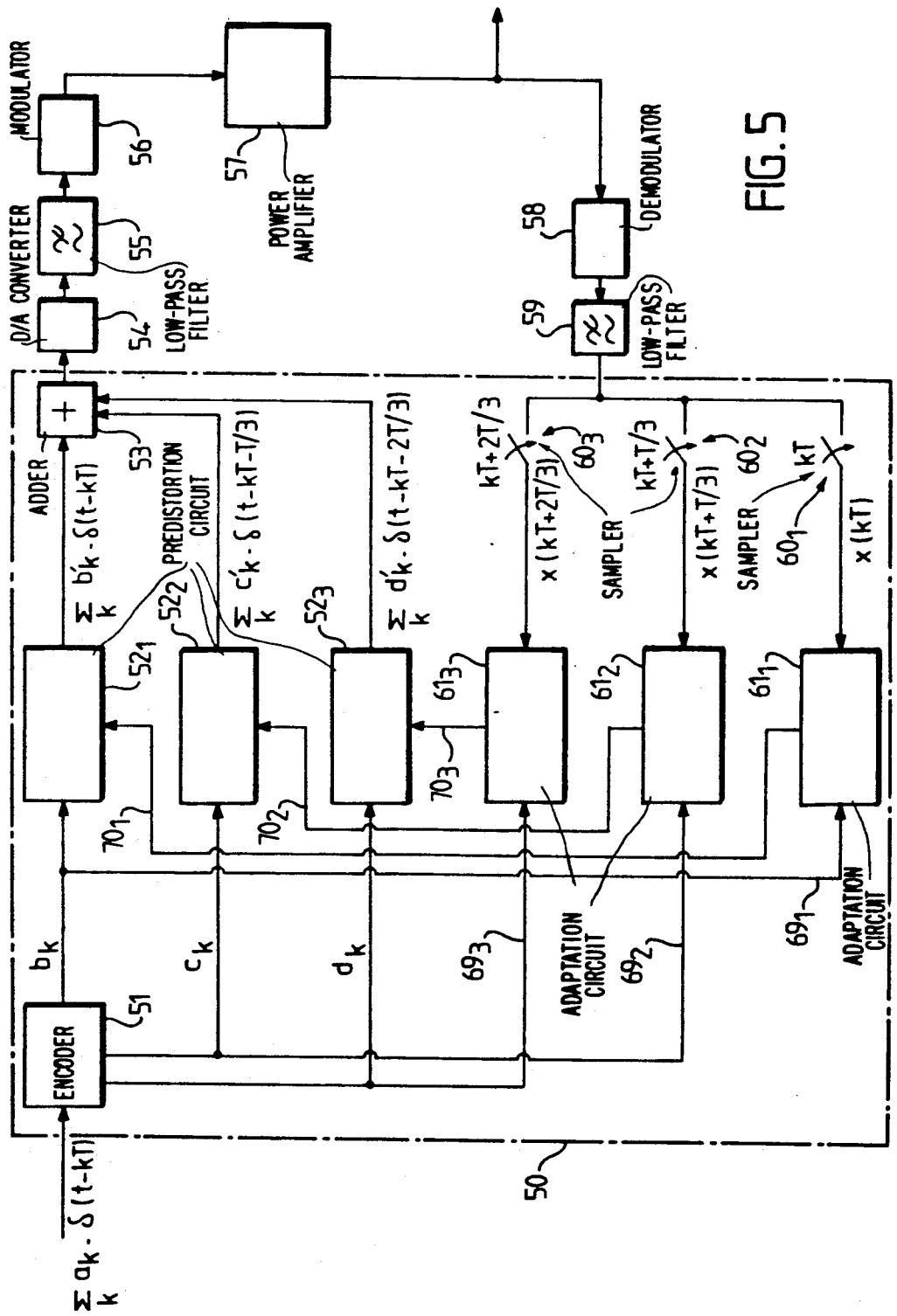
FIG. 5: a block diagram of an adaptive predistortion circuit according to a first embodiment of the invention.

FIG. 5 represents the block diagram of the section situated at the send end of a digital transmission system comprising an adaptive predistortion circuit 50 according to the invention. It comprises an encoder 51 which, on the basis of data $a_k$, generates data $b_k$, $c_k$ and $d_k$ corresponding with the send signal sampled at the instants kT, kT+T/3 and kT+2T/3 respectively. These data $b_k$, $c_k$ and $d_k$ enter the predistortion circuits $52_1$, $52_2$, $52_3$ respectively, supplying predistorted data $$\sum_k b'_k \cdot \delta(t - kT), \sum_k c'_k \cdot \delta(t - kT - T/3) \text{ and}$$

$$\sum_k d'_k \cdot \delta(t - kT - 2T/3),$$

where δ is the Dirac delta function. They are added together in the adder 53. The signal thus obtained passes through a digital-to-analog converter 54, a low-pass filter 55, a modulator 56 and a power amplifier 57 and is then conveyed to an antenna. In order to ensure the adaptation, the output signal of the amplifier 57 is demodulated in a demodulator 58 after which it is filtered in a low-pass filter 59. The output signal of the filter 59 is sampled by three samplers, in the first sampler $60_1$ at the instants kT, in the second sampler $60_2$ at the instants kT+T/3 and in the third sampler $60_3$ at the instants kT+2T/3, which samplers supply the samples x(kT), x(kT+T/3) and x(kT+2T/3) respectively, to three adaptation circuits $61_1$, $61_2$ and $61_3$. The latter circuits compare the samples x(kT), x(kT+T/3) and x(kT+2T/3) respectively, with the data $b_k$, $c_k$ and $d_k$. A conventional algorithm is used for calculating, for example, the difference between the two input signals of each adaptation circuit which consequently provides an updating of the predistortion circuits.

The most appropriate method of realizing the predistortion circuits is the use of random access memories (RAM). In such a realization a RAM will be addressed by the words $b_k$ and its output constitutes the series of predistorted symbols $b'_k$. The second RAM will be addressed by the data $c_k$ in order to provide the series $c'_k$. The third RAM will be addressed by the data $d_k$ in order to produce the series $d'_k$. The memories thus contain the predistorted values of the respective alphabets.

Figure 6:
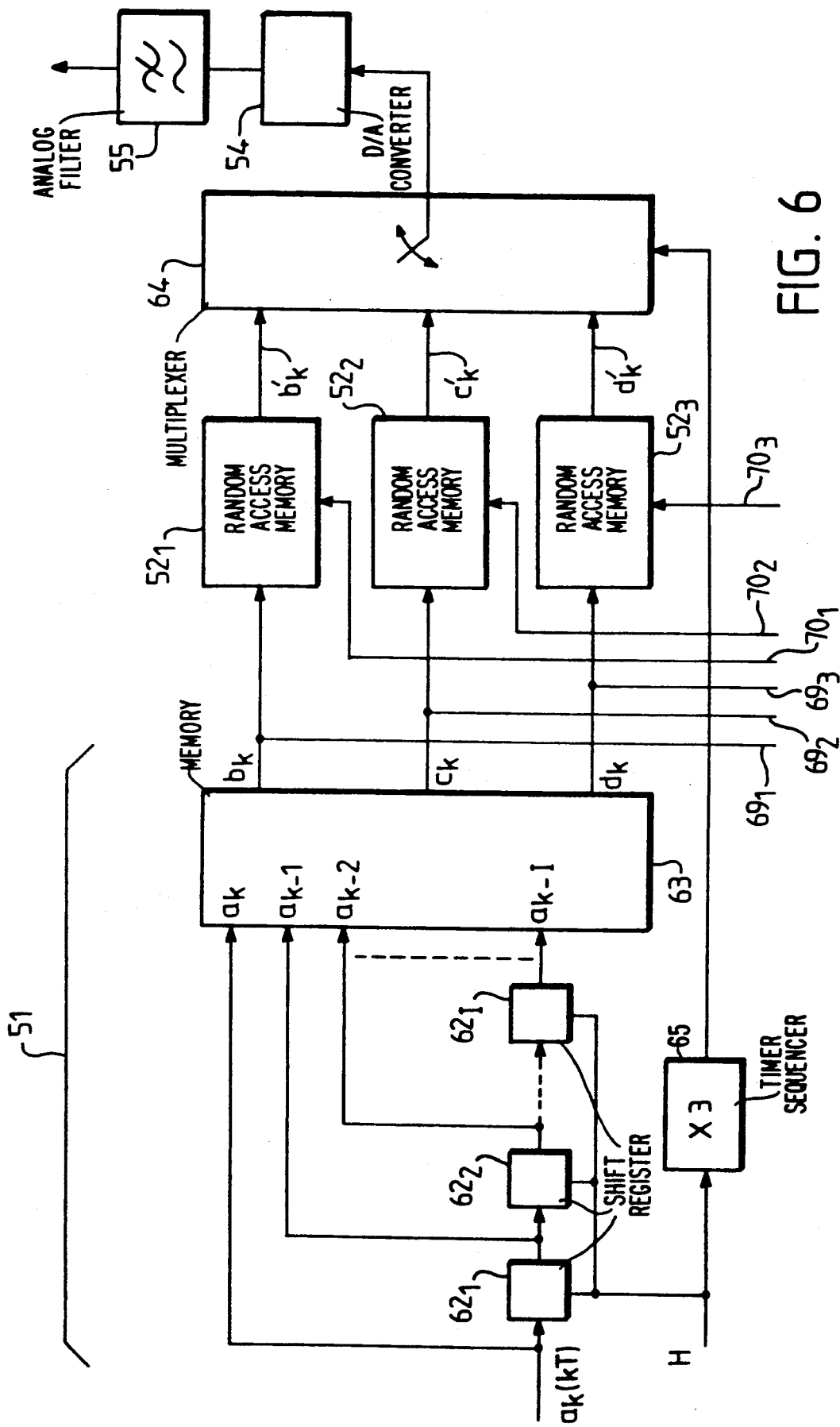
FIG. 6: a detailed diagram of the first variant of the first embodiment of the encoder comprising a memory.

FIG. 6 represents a variant of the embodiment of the encoder 51 which does not utilize the δ-function (that cannot be realized experimentally). It comprises a series of N shift registers $62_1$, $62_2$, ... $62_I$ having I stages, which store at a given instant the respective data $a_{k-1}$, $a_{k-2}$, ... $a_{k-I}$ at the command of the clock H (N is the number of bits of the symbols $a_k$). The value I is determined by the value n and by the truncation-length of the impulse response. The set of data $a_k$, $a_{k-1}$, ... $a_{k-I}$ is used for addressing a memory 63, for example, a programmable read-only memory (PROM) which performs the encoding of the data $a_k$ into data $b_k$, $c_k$ and $d_k$. These data enter the random access memories $52_1$, $52_2$, $52_3$ respectively, which perform the predistortion of the data $b_k$ into the data $b'_k$, the data $c_k$ into the data $c'_k$ and the data $d_k$ into the data $d'_k$, all three categories in-phase with the symbol clock H=1/T. The data $b'_k$, $c'_k$ and $d'_k$ are then fed to a multiplexer 64 which successively selects $b'_k$, $c'_k$ and $d'_k$ at the rate of a clock having a period of T/3 supplied by a timing sequencer 65. In this case, the multiplexer 64 then performs the addition by means of the adder circuit 53 of FIG. 5. Thus at the output a data train will be obtained representing the signal r(t) with $$r(t) = \sum_k [b'_k \cdot \delta(t - kT) + c'_k \cdot \delta(t - kT - T/3) +$$

$$d'_k \cdot \delta(t - kT - 2T/3)].$$

In this case the encoder 51 is constituted by the set of N shift registers having I stages $62_1$ to $62_I$ and by the memory 63. This digital signal passes through a digital-to-analog converter 54 an then through the analog G(ω) filter 55 which precedes the modulator.

The operation performed by the multiplexer 64 which selects the data $b'_k$, $c'_k$ and $d'_k$ at instants spaced by T/3, can also be performed before the predistortion circuits $52_1$, $52_2$ and $52_3$ themselves. They are updated by the respective adaptation circuits $61_1$, $61_2$ and $61_3$ (connecting lines $70_1$, $70_2$ and $70_3$, FIG. 5).

Figure 7:
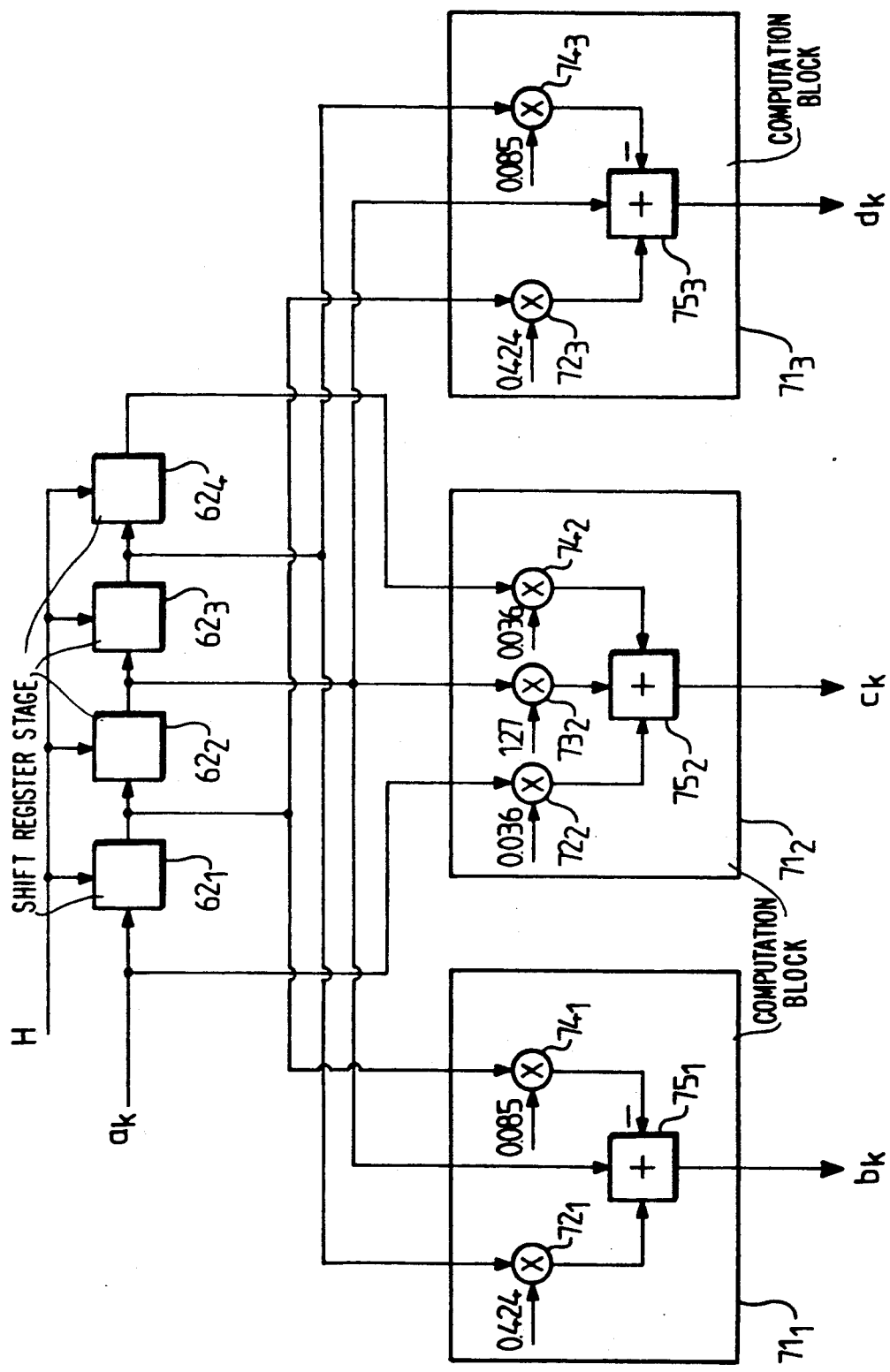
FIG. 7: a detailed diagram of the second variant of the first embodiment of the encoder comprising transversal filters in the case when n=1 and having a 15-sample truncation.

FIG. 7 represents a second variant of an embodiment of the encoder based on shift registers but in which data $b_k$, $c_k$, $d_k$ are not determined by means of a memory as shown in FIG. 6, but in which they are determined by means of a direct calculation with the aid of transversal filters. All the further elements are identical with those of FIG. 6. In FIG. 7 a set of shift registers having four stages $62_1$ to $62_4$ is used in order to produce data $a_k$ that are successively delayed by a clock period. In this example n=1 and the impulse response is truncated to 15 samples. The data $b_k$ are obtained by means of a computation block $71_1$ comprising:

a multiplier $72_1$ determining 0.424 $a_{k-3}$
a multiplier $74_1$ determining 0.085 $a_{k-1}$
an adder $75_1$ determining 0.424 $a_{k-3}$+$a_{k-2}$−0.085 $a_{k-1}$.

The data $c_k$ are obtained by means of a computation block $71_2$ comprising:

a multiplier $72_2$ determining 0.036 $a_k$
a multiplier $73_2$ determining 1.27 $a_{k-2}$
a multiplier $74_2$ determining 0.036 $a_{k-4}$
an adder $75_2$ determining 0.036 $a_k$+1.27 $a_{k-2}$+0.036 $a_{k-4}$ The data $d_k$ are obtained by means of a computation block $71_3$ comprising:

a multiplier $72_3$ determining 0.424 $a_{k-1}$
a multiplier $74_3$ determining 0.085 $a_{k-3}$ an adder $75_3$ determining $0.424\, a_{k-1} + a_{k-2} - 0.085\, a_{k-3}$.

It is very well possible to perform a different truncation of the impulse response and use a number of different stages for the shift registers. Thus, when in a case where n=2 a restriction to 9 samples is made and two shift register stages are used, the encoding can be realized by computing:

$$b_k = 1.698 a_{k-1} + a_{k-2}$$

$$c_k = 0.339 a_k + 2 a_{k-1} + 0.339 a_{k-2}$$

$$d_k = a_k + 1.698 a_{k-1}.$$

Figure 8:
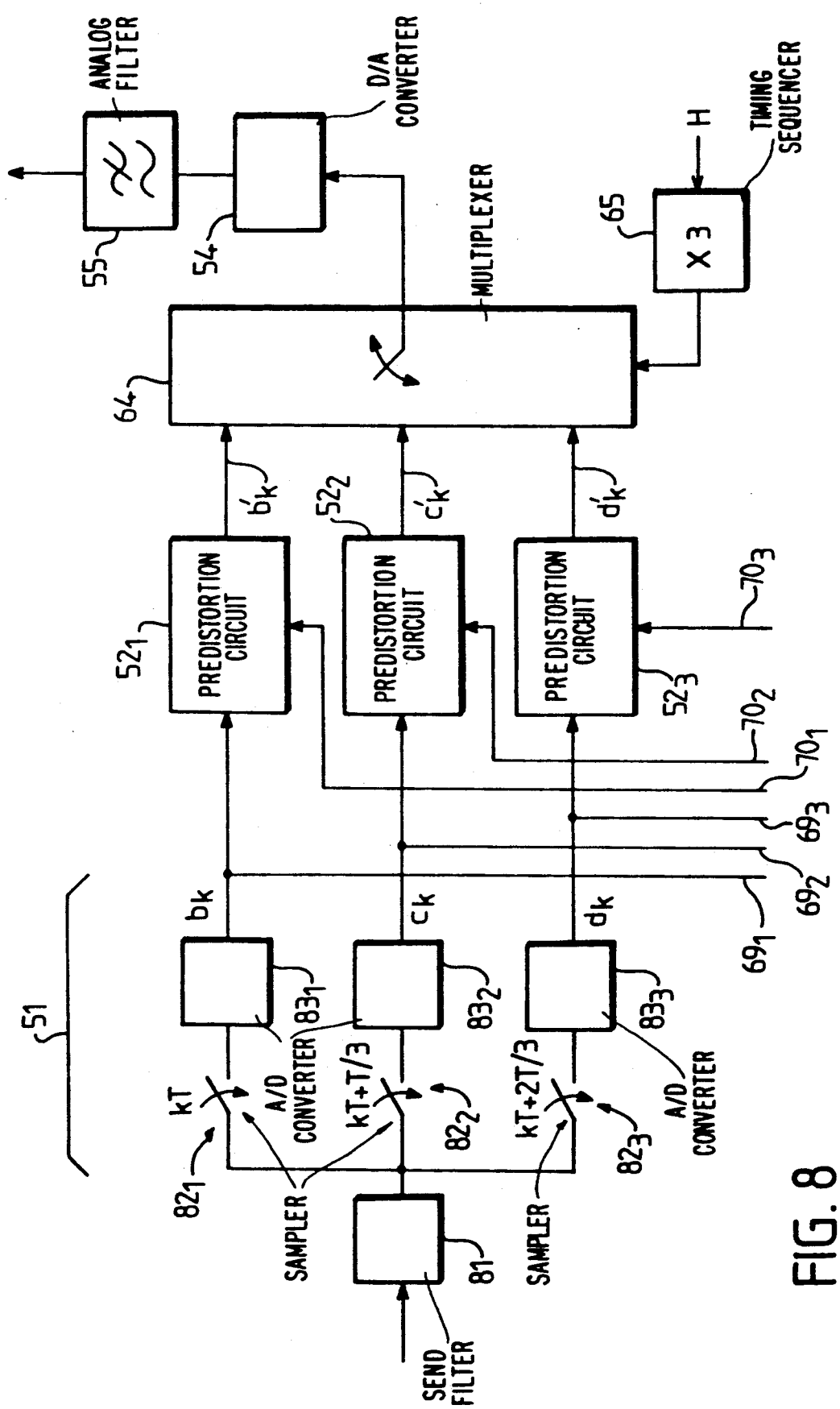
FIG. 8: a block diagram of an adaptive predistortion circuit according to a second embodiment of the invention.

FIG. 8 represents a second embodiment of the encoder 51. For this purpose, it comprises a send filter 81, having the transfer function $H(\omega)$, which realizes the polynomial encoding $F(D) = (1+D)^n$ with $D = 2T/3$ and also performs the low-pass filtering function $(-3T/(4T), 3T/(4T))$. Thus, at the output of this send filter one has quasi-discrete signal levels at instants kT, $kT+T/3$ and $kT+2T/3$. The output of the send filter 81 is connected to three paths each comprising a sampler $82_1$, $82_2$, $82_3$ and an analog-to-digital converter $83_1$, $83_2$, $83_3$, each path producing, with discrete levels, the data $b_k$, $c_k$ and $d_k$ that enter their respective predistortion circuits $52_1$, $52_2$, $52_3$. The other elements are identical with those of FIG. 6.

Figure 9:
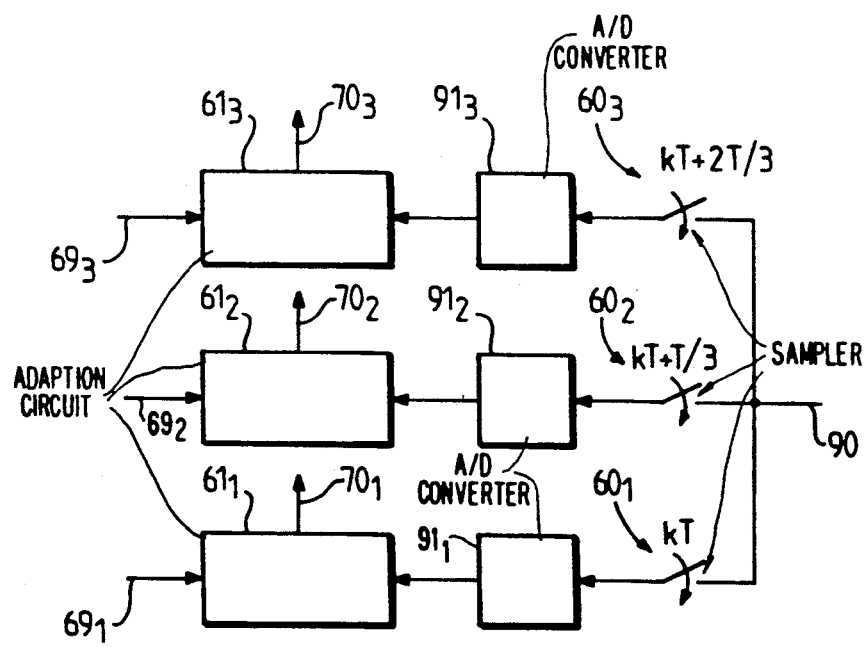
FIG. 9: a diagram of the samplers in the adaptation loop.

FIG. 9 represents a diagram of the samplers which are placed in the adaptation paths. The sent signal, after being demodulated and filtered, arrives at the connecting line 90. It is sampled by the three samplers $60_1$, $60_2$ and $60_3$ and the signals obtained are converted into digital signals by three analog-to-digital converters $91_1$, $91_2$, $91_3$. The digital signals of the three paths are compared to the respective signals $b_k$, $c_k$, $d_k$ (connecting lines $69_1$, $69_2$, $69_3$) to produce the adaptation signals (connecting lines $70_1$, $70_2$, $70_3$).

The signal sent by the transmitter and subsequently received by a receiver at the other end of the transmission system has to undergo a filtering on reception which is determined so that the filtering at the send end associated to the filtering at the receive end approximately corresponds to a Nyquist filtering having an adequate roll-off factor. It is this roll-off factor that determines the protection against adjacent channel interference. In order to illustrate the results obtained with the invention let us take, by way of example, a 64-QAM system with 140 Mbits/s operating in a frequency scheme with a 30 MHz channel spacing. For this system a roll-off factor of $\alpha = 0.32$ in a Nyquist filtering equally distributed over send and receive ends provides a protection of 63.8 dB. In order to obtain the same protection in the system according to the invention the overall filtering is to have a lower roll-off factor. In this example, the choice of n=1 as the order of the encoding polynomial at the send end requires a roll-off factor of 0.15 in the overall filtering in order to attain a protection of 63.8 dB against adjacent channel interference.

According to the invention, with a 256-QAM system with $2 \times 140$ Mbits/s in a frequency scheme with a 40 MHz channel spacing, the gain provided by the invention is approximately 3 dB compared with prior-art predistortion techniques.

We claim:

1. Adaptive predistortion circuit for a digital transmission system for sending input data at the rate of a symbol clock having a period T with the aid of a modulator and a power amplifier which distorts the data, the circuit comprising:

a predistortion circuit for predistorting in the opposite sense the input data prior to their entering the amplifier in order to transmit the expected input data;

an adaptation circuit for continuously adapting the predistortion circuit to the stream of input data in response to a demodulation of the stream of transmitted data; and a filter for signal shaping; characterized in that the adaptive predistortion circuit further comprises an encoder for generating, on the basis of digital data $a_k$ (k being an integer):

on a first path, digital data $b_k$ leaving a first predistortion circuit in a predistorted condition as digital data $b'_k$ in-phase with the symbol clock;

on a second path, digital data $c_k$ leaving a second predistortion circuit in a predistorted condition, as digital data $c'_k$ phase-shifted by T/3 with respect to the symbol clock;

on a third path, digital data $d_k$ leaving a third predistortion circuit on a predistorted condition as digital data $d'_k$ phase-shifted by 2T/3 with respect to the symbol clock;

the signals $b_k$, $c_k$ and $d_k$ being obtained at the instants kT, $kT+T/3$, $kT+2T/3$ by means of an n-th order polynomial encoding of the type of $F(D) = (1+D)^n$, where D is a delay of 2T/3, the encoding being associated to an ideal low-pass filtering of bandwidth $(-3/(4T), 3/(4T))$, the encoding and filtering jointly operating on the data $a_k$ in accordance with a frequency-shaping filtering given by the transfer function:

$$H(\omega) = \cos^n(\omega T/3) \text{ for } |\omega| \leq 3\pi/(2T)$$

where n is a positive integer; the predistorted data of the three paths being added together in an adder circuit and then converted into an analog signal by a digital-to-analog converter, the analog signal being filtered by the low-pass output filter whose ideal transfer function is equal to 1 for $f < 3/(4T)$ and zero for $f > 9/(4T)$, f being the frequency, after which it is sent to the modulator and then to the amplifier, the sent data being demodulated and then digitized so as to realize the adaptation with the aid of three adaptation circuits, one operating in-phase and the others phase-shifted by T/3 and 2T/3 with respect to the symbol clock for adapting each corresponding predistortion circuit.

2. Adaptive predistortion circuit as claimed in claim 1, characterized in that the encoder determines the data $b_k$, $c_k$ and $d_k$ so that:

$$b_k = \sum_{i=-J}^{J} h_{i,0} \cdot a_{k-i} \quad \text{with } h_{i,0} = h(iT).$$

$$c_k = \sum_{i=-J}^{J} h_{i,1} \cdot a_{k-i} \quad \text{with } h_{i,1} = h(iT + T/3)$$

$$d_k = \sum_{i=-J}^{J} h_{i,2} \cdot a_{k-i} \quad \text{with } h_{i,2} = h(iT + 2T/3)$$

where $h_{i,0}$, $h_{i,1}$ and $h_{i,2}$ are coefficients of the impulse response $h(t)$ of the filter $H(\omega)$ characterizing the spectral signal shaping at the send end, and where $(2J+1) \cdot T$ is the truncating length of the impulse response $h(t)$.

3. Adaptive predistortion circuit as claimed in claim 2, characterized in that the encoder comprises a set of shift registers having I stages, where $I = 2J + 1$, in which the data $a_k, a_{k-1}, a_{k-2} \ldots a_{k-I}$ pass that are used to address at least one memory which performs the encoding of the data $a_k$ into data $b_k$, $c_k$ and $d_k$.

4. Adaptive predistortion circuit as claimed in claim 2, characterized in that the encoder is a transversal filter comprising a set of shift registers having I stages in which the data $a_k, a_{k-1}, a_{k-2} \ldots a_{k-I}$ pass, which are multiplied:

on a first path by the respective coefficients $h_{i,0}$, the products being added together to produce the data $b_{k}$;

on a second path by the respective coefficients $h_{i,1}$, the products being added together to produce the data $c_{k}$;

on a third path by the respective coefficients $h_{i,2}$, the products being added together to produce the data $d_k$.

5. Adaptive predistortion circuit as claimed in claim 2, characterized in that the adder circuit is constituted by a multiplexer taking the predistorted data $b'_k$, $c'_k$ and $d'_k$ according to their own timing in order to send them to the modulator.

6. Adaptive predistortion circuit as claimed in claim 2, characterized in that the three adaptation paths each comprise an analog-to-digital converter preceded by a sampler inserted before the adaption circuits.

7. Adaptive predistortion circuit as claimed in claim 2, characterized in that the predistortion circuits are random access memories supplying the predistorted values on the in-phase path and on the two phase shifted paths.

8. Adaptive predistortion circuit as claimed in claim 1, characterized in that the encoder comprises an analog send filter at the transmit end having the transfer function $H(\omega)$, whose output is connected to three samples operating at the respective instants kT, kt+T/3 and kT+2T/3, which samplers are connected each to an analog-to-digital converter to produce the respective digital data $b_k$, $c_k$, $d_k$.

9. Adaptive predistortion circuit as claimed in claim 1, characterized in that the adder circuit is constituted by a multiplexer taking the predistorted data $b'_k$, $c'_k$ and $d'_k$ according to their own timing in order to send them to the modulator.

10. Adaptive predistortion circuit as claimed in claim 1, characterized in that the three adaptation paths each comprise an analog-to-digital converter preceded by a sampler inserted before the adaptation circuits.

11. Adaptive predistortion circuit as claimed in claim 1, characterized in that the predistortion circuits are random access memories supplying the predistorted values on the in-phase path and on the two phase shifted paths.

* * * * *